US010440838B2

(12) United States Patent
Heo et al.

(10) Patent No.: US 10,440,838 B2
(45) Date of Patent: Oct. 8, 2019

(54) DISPLAY DEVICE HAVING A BENDABLE DISPLAY PANEL AND A SUPPORT FOR SUPPORTING THE BENDABLE DISPLAY PANEL

(71) Applicant: LG ELECTRONICS INC., Seoul (KR)

(72) Inventors: Jinha Heo, Seoul (KR); Jihoon Han, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/660,142

(22) Filed: Jul. 26, 2017

(65) Prior Publication Data

US 2018/0220537 A1 Aug. 2, 2018

(30) Foreign Application Priority Data

Jan. 31, 2017 (KR) .................. 10-2017-0013895

(51) Int. Cl.
*H05K 5/00* (2006.01)
*G06F 3/14* (2006.01)
*H05K 5/02* (2006.01)
*G09F 9/30* (2006.01)
*G09F 9/302* (2006.01)
*F16M 11/00* (2006.01)

(52) U.S. Cl.
CPC ......... *H05K 5/0017* (2013.01); *G06F 3/1446* (2013.01); *G09F 9/301* (2013.01); *G09F 9/3026* (2013.01); *H05K 5/0217* (2013.01); *F16M 11/00* (2013.01)

(58) Field of Classification Search
CPC ... H05K 5/0017; H05K 5/0217; G06F 3/1446
See application file for complete search history.

(56) References Cited

U.S. PATENT DOCUMENTS 9,839,145 B2 * 12/2017 Ryu .................. G09F 9/301
2014/0118910 A1 * 5/2014 Sung ................. G09F 9/301
361/679.01
2014/0198465 A1 * 7/2014 Park .................. H05K 5/0226
361/749

(Continued)

FOREIGN PATENT DOCUMENTS

EP 3 113 161 1/2017
WO WO 2015/102438 7/2015

OTHER PUBLICATIONS

European Search Report dated Jun. 13, 2018 issued in Application No. 17205793.7.

*Primary Examiner* — Binh B Tran
*Assistant Examiner* — Douglas R Burtner
(74) *Attorney, Agent, or Firm* — KED & Associates LLP

(57) ABSTRACT

A display device is disclosed, in which a plurality of displays are arranged to output an image, and a gap is not generated between the displays even if the displays are bent. The display device comprises a display panel configured to bend; a support coupled to the display panel to support the display panel; a connecting rod having a first end rotatably coupled to the display panel and a second end slidably coupled to the support; wherein, when the display panel is controlled to bend, the connecting rod rotates relative to the first display panel and simultaneously slides relative to the support.

18 Claims, 15 Drawing Sheets

(56) References Cited

U.S. PATENT DOCUMENTS

| | | | |
|---|---|---|---|
| 2015/0043136 A1* | 2/2015 | Kim | G02F 1/133305 361/679.01 |
| 2015/0092361 A1* | 4/2015 | Cho | H02K 7/00 361/749 |
| 2015/0130775 A1* | 5/2015 | Kim | G06F 1/1652 345/205 |
| 2015/0192952 A1* | 7/2015 | Jung | G06F 1/1601 361/747 |
| 2015/0296641 A1* | 10/2015 | Song | H05K 5/0217 361/679.01 |
| 2016/0127674 A1* | 5/2016 | Kim | G09G 5/003 348/739 |
| 2016/0252236 A1* | 9/2016 | Chen | G02F 1/133 362/97.1 |
| 2016/0295711 A1* | 10/2016 | Ryu | G09F 9/301 |
| 2017/0033154 A1 | 2/2017 | Lan et al. | |
| 2017/0249119 A1* | 8/2017 | Ding | G09F 9/33 |
| 2017/0295655 A1* | 10/2017 | Jung | G06F 1/1601 |
| 2017/0347466 A1* | 11/2017 | Kang | H05K 5/0017 |
| 2018/0114471 A1* | 4/2018 | Park | G09F 9/301 |

\* cited by examiner (a)

(b)

(c)

DISPLAY DEVICE HAVING A BENDABLE DISPLAY PANEL AND A SUPPORT FOR SUPPORTING THE BENDABLE DISPLAY PANEL

CROSS-REFERENCE TO RELATED APPLICATIONS

Pursuant to 35 U.S.C. § 119(a), this application claims the benefit of earlier filing date and right of priority to Korean Application No. 10-2017-0013895, filed on Jan. 13, 2017, the contents of which are hereby incorporated by reference herein in their entirety.

BACKGROUND OF THE INVENTION

Field of the Invention

The present invention relates to a display device that includes a plurality of variably bent displays to provide image information and fixes the displays.

Discussion of the Related Art

A plurality of display panels which may be physically detachable may be implemented as one device to output an image of large inches.

For convenience of description, a physical type having each of a plurality of display panels is defined as a display. That is, the display device may include a plurality of displays.

For example, a plurality of displays may be arranged at a matrix arrangement. If the respective displays have rectangular shapes of same or similar sizes, the display device of the matrix arrangement may be configured.

If each display is a variably bent flexible display, various types of screens may be provided to users through combination of the plurality of displays.

However, a problem occurs in that a distance between boundaries of adjacent displays may be varied in view of properties of the flexible display.

Since this problem is not suitable for a basic condition of the display device that should display continuous screens, it is required to solve this problem.

SUMMARY OF THE INVENTION

Accordingly, the present invention is directed to a display device that substantially obviates one or more problems due to limitations and disadvantages of the related art.

An object of the present invention is to provide to a display device that solves a gap generated when each of a plurality of displays is bent.

Additional advantages, objects, and features of the specification will be set forth in part in the description which follows and in part will become apparent to those having ordinary skill in the art upon examination of the following or may be learned from practice of the specification. The objectives and other advantages of the specification may be realized and attained by the structure particularly pointed out in the written description and claims hereof as well as the appended drawings.

To achieve these objects and other advantages and in accordance with the purpose of the specification, as embodied and broadly described herein, a display device according to one aspect of the present invention comprises a display panel configured to bend; a support coupled to the display panel to support the display panel; a connecting rod having a first end rotatably coupled to the display panel and a second end slidably coupled to the support; wherein, when the display panel is controlled to bend, the connecting rod rotates relative to the first display panel and simultaneously slides relative to the support.

According to another aspect of the present invention, a multivision display device according to one aspect of the present invention comprises a plurality of display panels arranged in a prescribed number of rows and a prescribed number of columns, the plurality of display panels being configured to bend; a support coupled to the plurality of display panels to support the plurality of display panels; and a connecting rod coupled between the plurality of display panels and the support, the connecting rod having a first end rotatably coupled to the plurality of display panels and a second end slidably coupled to the support, wherein, when the plurality of display panels is configured to bend, the connecting rod rotates relative to the plurality of display panels and simultaneously slides relative to the frame.

Advantageous effects of the display device according to the present invention are as follows.

According to at least one of the embodiments of the present invention, it is advantageous that a gap between displays is not generated even in the case that the display is bent.

According to at least one of the embodiments of the present invention, it is advantageous that a plurality of displays may be fixed stably.

According to at least one of the embodiments of the present invention, it is advantageous that a weight of the display device may be minimized through minimum required types of a horizontal bar and a vertical bar.

Effects obtainable from the present invention may be non-limited by the above mentioned effect. And, other unmentioned effects can be clearly understood from the following description by those having ordinary skill in the technical field to which the present invention pertains.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. The above and other aspects, features, and advantages of the present invention will become more apparent upon consideration of the following description of preferred embodiments, taken in conjunction with the accompanying drawing figures. In the drawings.

DETAILED DESCRIPTION OF THE PREFERRED EMBODIMENTS

Figure 1:
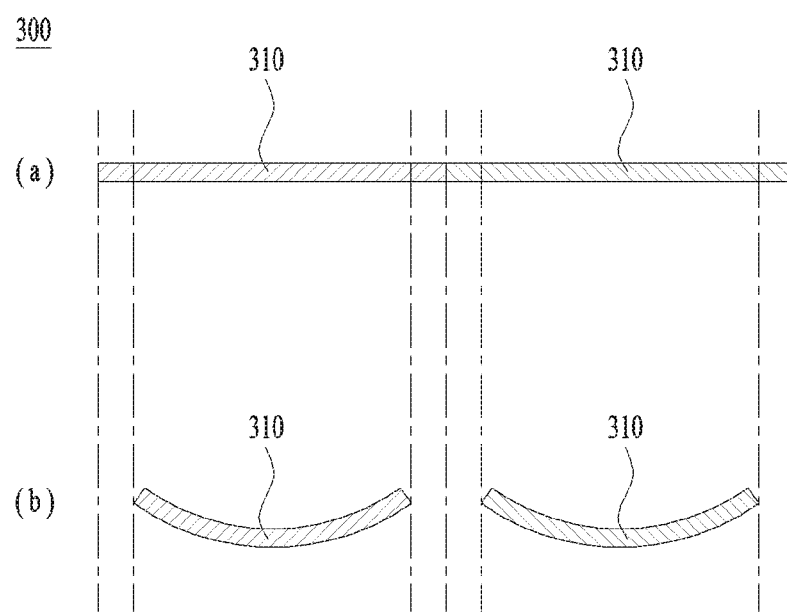
FIG. 1 is a conceptual view illustrating a display device that includes a plurality of displays according to the related art.

Description will now be given in detail according to exemplary embodiments disclosed herein, with reference to the accompanying drawings. For the sake of brief description with reference to the drawings, the same or equivalent components may be provided with the same reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In the present disclosure, that which is well-known to one of ordinary skill in the relevant art has generally been omitted for the sake of brevity. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element can be connected with the other element or intervening elements may also be present. In contrast, when an element is referred to as being "directly connected with" another element, there are no intervening elements present.

A singular representation may include a plural representation unless it represents a definitely different meaning from the context. Terms such as "include" or "has" are used herein and should be understood that they are intended to indicate an existence of several components, functions or steps, disclosed in the specification, and it is also understood that greater or fewer components, functions, or steps may likewise be utilized.

A plurality of display panels which may be physically detachable may be implemented as one device to output an image of large inches.

For convenience of description, a physical type having each of a plurality of display panels is defined as a display. That is, the display device may include a plurality of displays.

For example, a plurality of displays may be arranged at a matrix arrangement. If the respective displays have rectangular shapes of same or similar sizes, the display device of the matrix arrangement may be configured.

If each display is a variably bent flexible display, various types of screens may be provided to users through combination of the plurality of displays.

However, a problem occurs in that a distance between boundaries of adjacent displays may be varied in view of properties of the flexible display.

Since this problem is not suitable for a basic condition of the display device that should display continuous screens, it is required to solve this problem.

FIG. 1 is a conceptual view illustrating a display device 300 that includes a plurality of displays 310 according to the related art.

For convenience of understanding, it is assumed that the plurality of displays 310 are bent at both direction and arranged in a horizontal direction.

FIG. 1(a) is a conceptual view illustrating a display device 300 of a first state according to the related art, viewed from the top end, and FIG. 1(b) is a conceptual view illustrating a display device 300 of a second state according to the related art, viewed from the top end.

Boundaries between the plurality of displays 310 may be provided to be matched with each other at the first state that the plurality of displays 310 are flat. The plurality of displays 310 are fixed by a holder device.

It is assumed that each of the plurality of displays 310 becomes the second stat that it is bent to be concave. As the holder device equally fixes the plurality of displays 310, a gap is generated between the respective displays 310.

Figure 2:
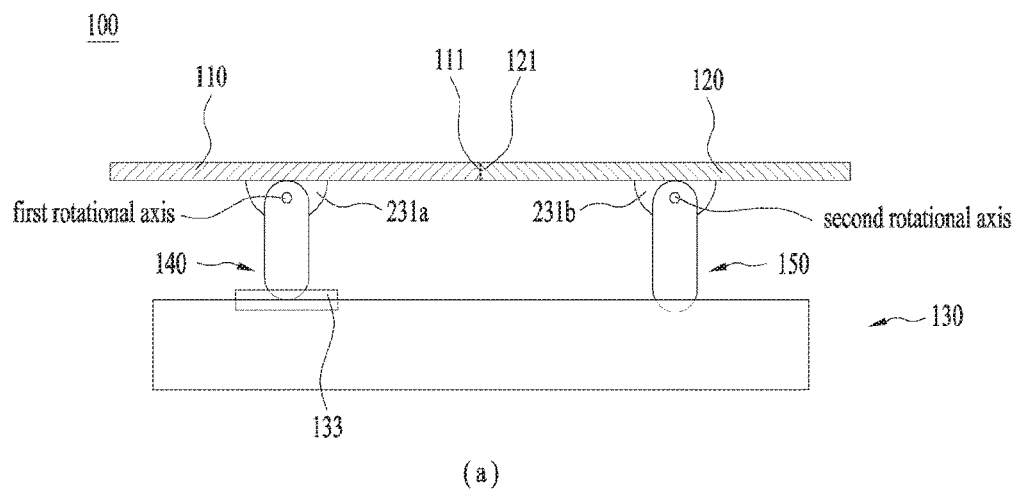
FIG. 2 is a conceptual view illustrating a display device according to one embodiment of the present invention.
Figure 2:
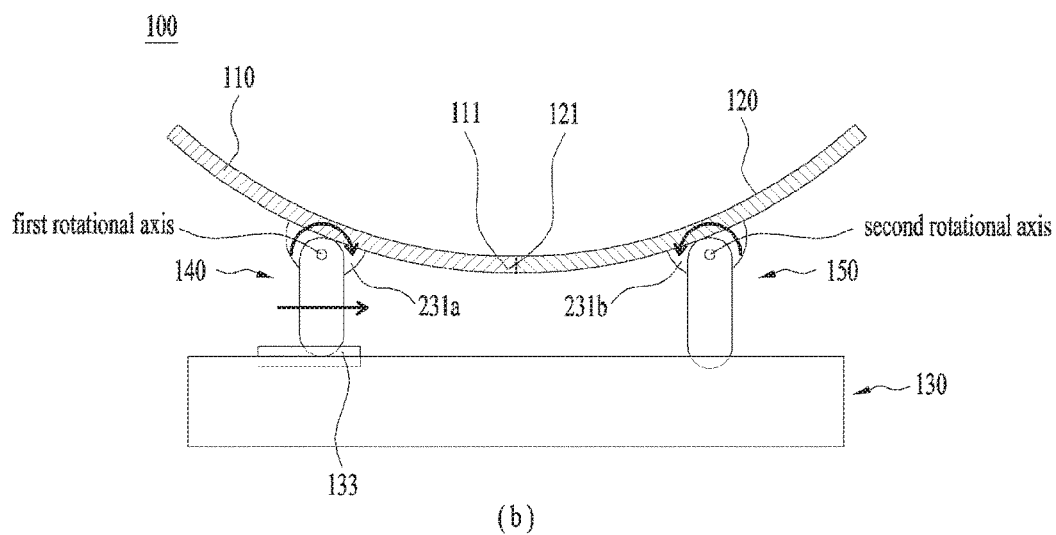
Figure 2:
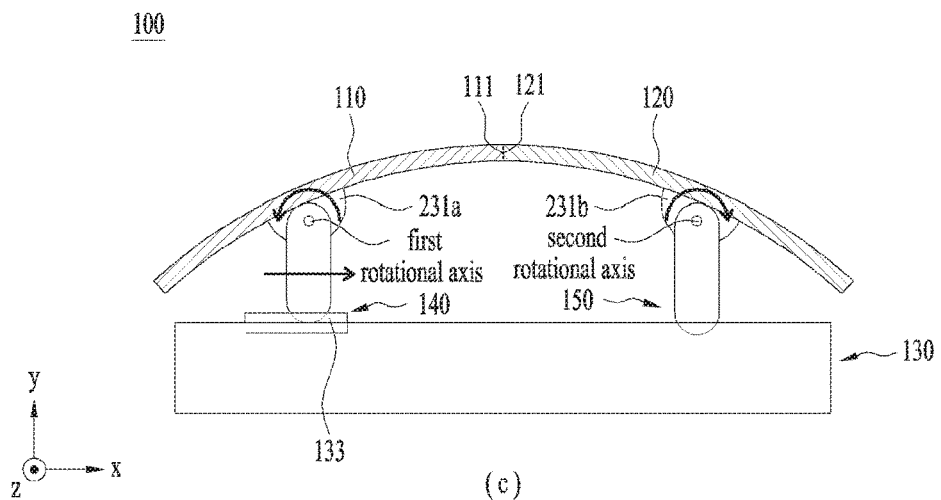

FIG. 2 is a conceptual view illustrating a display device 100 according to one embodiment of the present invention.

Generally, among holding type displays of certain inches or more such as TV, a flexible display which is variably bent or a curved display which is provided at a bent state is generally bent in a horizontal direction, that is, a left and right direction. Therefore, the present invention will be described based on a display which is bent in a left and right direction. However, the present invention is not limited to the display which is bent in a left and right direction, and may include a display which is bent in an up and down direction. In case of the display which is bent in an up and down direction, it may be regarded that features applied to the present invention are rotated at 90 degrees.

In view of discussion related to the problem of FIG. 1, it is assumed that a plurality of displays which are bent in a left and right direction are arranged in a horizontal direction. Particularly, two displays arranged in parallel in a horizontal direction will be described. For convenience of description, the display provided at one side of the two displays will be defined as a first display 110, and the display provided at the other side of the two displays will be defined as a second display 120.

Unlike the type of FIG. 1, the first display 110 and the second display 120 are connected with each other. Particularly, the first display 110 and the second display 120 may be connected with each other in such a manner that their adjacent edges 111 and 121 adjoin each other.

The state that the inner edge 111 of the first display 110 and the inner edge 121 of the second display 120 are connected with each other is maintained even in the case that the displays 110 and 120 are bent.

Details of a connection method of the first display 110 and the second display 120 will be described later.

A support 130 provides relative displacement with respect to each movement of the first display 110 and the second display 120.

The first display 110 and the support 130 are connected with each other through a first rotator 231a and a first connector 140, and the second display 120 and the support 130 are connected with each other through a second rotator 231b and a second connector 150.

The first connector 150 is slidably coupled to the support 130. Particularly, the first connector 140 may be slid along a first direction.

The first rotator 231a is fixed to the first display 110 and rotatably coupled to the first connector 140. That is, the first rotator 231a forms a rotational structure that the first display 110 may be rotated with respect to the first connector 140. The first rotator 231a is rotatably coupled to the first connector 140 based on a first rotational axis.

The second connector 150 is fixed to the support 130. That is, unlike the first connector 140, the second connector 150 is not slid with respect to the support 130.

The second rotator 231b is fixed to the second display 120 and rotatably coupled to the second connector 150. That is, the second rotator 231b forms a rotational structure that the second display 120 may be rotated with respect to the second connector 150. The second rotator 231b is rotatably coupled to the second connector 150 based on a second rotational axis.

FIG. 2(a) illustrates a flat state before the displays 110 and 120 are bent, FIG. 2(b) illustrates a state that front surfaces of the displays 110 and 120 are bent to be concave, and FIG. 2(c) illustrates a state that front surfaces of the displays 110 and 120 are bent to be convex, wherein the states are viewed from a vertical direction of the display device 100.

If the first display 110 and the second display 120 are bent with respect to the first direction, a straight distance between the displays 110 and 120 is varied with respect to the first direction. At this time, the first connector 140 is slid together with the first display 110 to maintain connection of the displays 110 and 120, and the first and second rotators 231a and 231b are rotated.

The expression that the first and second displays 110 and 120 are bent with respect to the first direction means that the center of curvature of the first and second displays 110 and 120 is vertical to the first direction. For example, if FIG. 2 illustrates the display device 100 viewed from the upper surface, the first direction means a left and right direction (x-axis direction) that the first and second displays 110 and 120 are arranged, and means that the first and second displays 110 and 120 are bent as shown in FIG. 2(b) or 2(c) based on a specific axis of a vertical direction (z-axis direction) as the center of curvature.

In more detail, if the first and second displays 110 and 120 of the flat state as shown in FIG. 2(a) are bent to be concave as shown in FIG. 2(b), the first rotator 231a is rotated clockwise along the first display 110, the second rotator 231b is rotated counterclockwise along the second display 120, and the first connector 140 is slide to be close to the second connector 150. This is because that the straight distance between the first display 110 and the second display 120 with respect to the first direction becomes short by bending of the first and second displays 110 and 120.

If the front surfaces of the first and second displays 110 and 120 are changed from the state of FIG. 2(a) to the state that they are bent to be convex as shown in FIG. 2(c), the first rotator 231a is rotated counterclockwise along the first display 110, the second rotator 231b is rotated clockwise along the second display 120, and the first connector 140 is slide to be close to the second connector 150. This is because that the straight distance between the first display 110 and the second display 120 with respect to the first direction becomes short by bending of the first and second displays 110 and 120 in the same manner that the state of FIG. 2(a) is changed to the state of FIG. 2(b).

In the case that the state of FIG. 2(b) is changed to the state of FIG. 2(a) or the state of FIG. 2(c) is changed to the state of FIG. 2(a), a rotational direction and a sliding direction become opposite to the aforementioned case. That is, the rotational direction of the first rotator 231a is opposite to that of the second rotational direction 231b, and the first connector 140 is slid to be far away from the second connector 150.

Since the first rotator 231a is provided to be fixed to the first display, the rotational direction of the first rotator 231a may be the same as the rotational direction of the first display, and since the second rotator 231b is provided to be fixed to the second display, the rotational direction of the second rotator 231b may be the same as the rotational direction of the second display. However, since the first display 110 and the second display 120 are bent by themselves, rotation of the displays 110 and 120 means a general trend and may not mean an exact rotational direction of each area.

Figure 3:
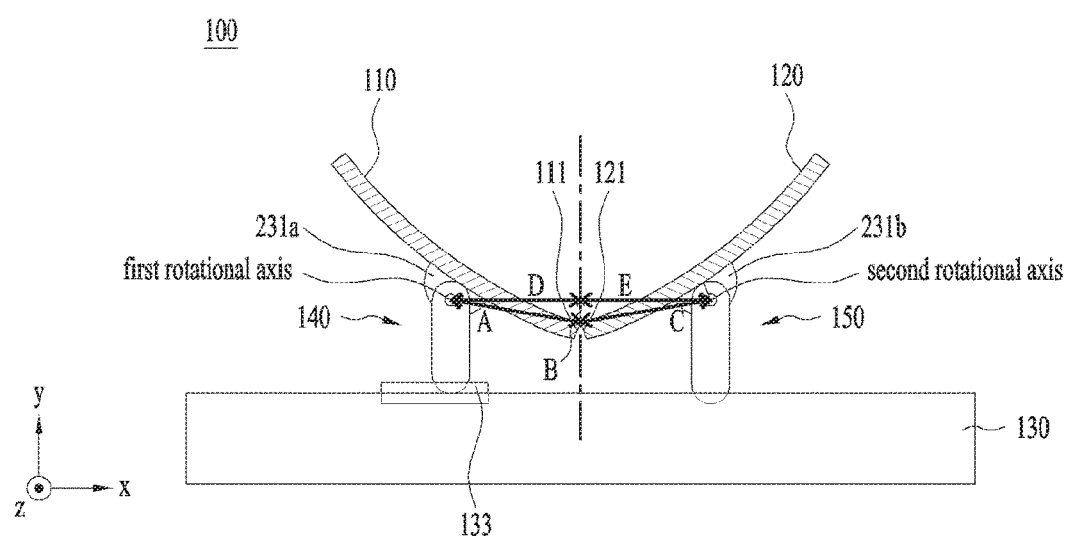
FIG. 3 is a brief view illustrating one state of a display device according to the present invention.

FIG. 3 is a brief view illustrating one state of a display device 100 according to the present invention.

If a bending level of the first display 110 is determined, a distance A from the first rotational axis to the inner edge 111 of the first display 110 is determined. If a bending level of the second display 120 is determined, a distance C from the second rotational axis to the inner edge 121 of the second display 110 is determined.

If the distance from the support 130 of the inner edge 111 of the first display 110 or the inner edge 121 of the second display 120 is specified, a distance B is determined, and distances D and E are also specified. Therefore, a sliding distance of the first connector 140 is also determined.

The bending levels of the first display 110 and the second display 120 may be independent from each other. For example, even in the case that the front surface of the first display 110 is bent to be convex and the front surface of the second display 120 is bent to be concave, a mechanism of the present invention is implemented. Also, it is not required that each of the displays 110 and 120 should have a certain curvature radius. That is, if each of the displays 110 and 120 is bend toward the center of curvature in a z-axis direction, bending shapes of the displays 110 and 120 may have an untypical function type including elliptic equation, parabolic equation, hyperbolic equation not circle equation based on x-y plane.

Also, it is not required that the first rotational axis and the second rotational axis of each rotator 231 should be matched with each other based on the center of a horizontal direction of each of the displays 110 and 120. However, for safety related to center of gravity of the device, it is preferable that the first rotator 231a and the second rotator 231b are arranged to arrange the first rotational axis and the second rotational axis to be arranged at the horizontal center of each of the displays 110 and 120.

Preferably, the distance from one end to the other end of each of the first connector 140 and the second connector 150 is assured of a specific distance or more. In more detail, even in the case that the edges 111 and 121 where the first display 110 and the second display 120 meet each other become close to the support 130 as the front surfaces of the first display 110 and the second display 120 are bent to be concave, each of the connectors 140 and 150 may be formed at a sufficient length so as not to reach the support 130.

On the contrary, if the front surfaces of the first display 110 and the second display 120 are bent to be convex, avoidance design of the support 130 is required such that the outer area of the first display 110 and the outer area of the second display 120 do not interfere with the support 130.

Figure 4:
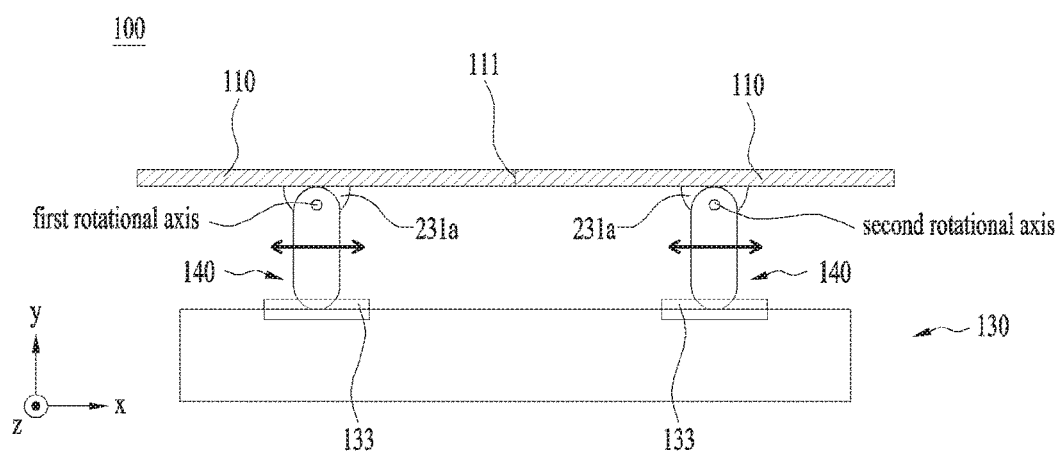
FIG. 4 is a view illustrating a display device according to another embodiment of the present invention.

FIG. 4 is a view illustrating a display device 100 according to another embodiment of the present invention.

The second connector 150 may be fixed so as not to be rotated with respect to the support 130 in the same manner as the embodiment of FIG. 2. This is because that the states of the first display 110 and the second display 120 may move without being fixed due to unnecessary increase of degree of freedom if two connectors coupled to the respective displays 110 and 120 are rotatably or slidably coupled to the support 130 without being fixed thereto.

However, unlike the embodiment of FIG. 2, two connected displays 110 may be coupled to the support 130 through the first connector 140 which is slidable. When the two displays 110 are movable toward a first direction, it is advantageous that the displays may be arranged flexibly even in the case that the support 130 is fixed to the ground.

Figure 5:
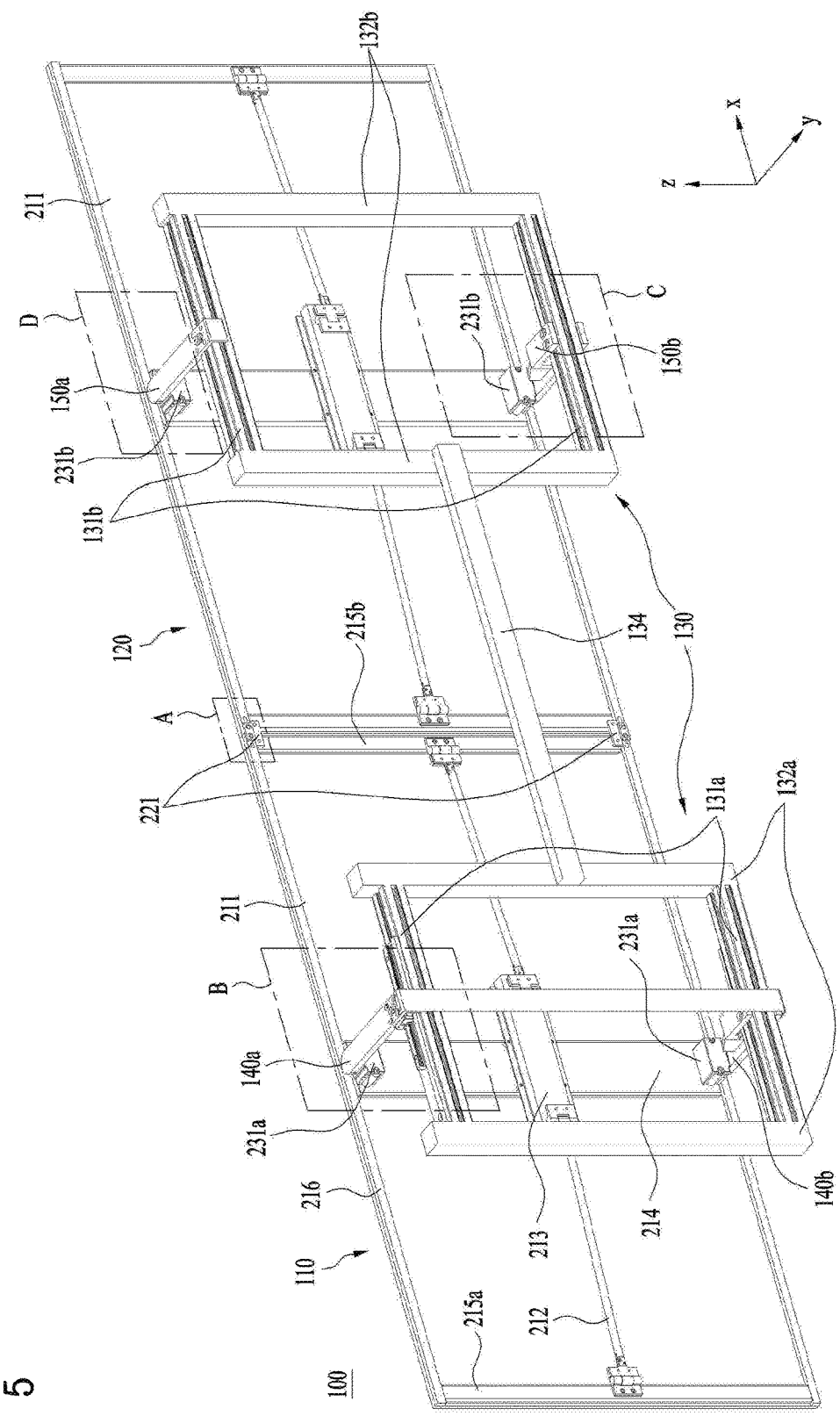
FIG. 5 is a rear perspective view illustrating a display device according to the present invention.

FIG. 5 is a rear perspective view illustrating a display device 100 according to the present invention.

The display device 100 of this embodiment has a 2×1 matrix arrangement that two displays of the first display 110 and the second display 120 are arranged in parallel in a horizontal direction as shown in FIG. 3.

In an m×n matrix arrangement, m means the number of columns in the display, and n means the number of rows.

However, as described above, the matrix arrangement may be enlarged to a greater number of display arrangements such as 2×2, 2×4, and 4×2 within the range that does not depart from the features of the present invention. Details of this arrangement will be described later.

Each of the displays 110 and 120 physically includes a case 101 forming an external appearance by surrounding a display panel, a front surface, a lateral surface and a rear surface of the display panel. The case 101 may include a back plate 211 provided on the rear surface of the display panel, protecting the rear surface of the display panel and providing rigidity.

Electronic components such as an interface board and a controller, which are intended for driving of the display panel, may be provided at a predetermined space on the rear surface of the back plate 211.

In the display device 100, components excluding basic output components such as the displays 110 and 120 including the back plate 211, the interface board and the controller will be defined as a display holder device. Simply, the display holder device indicates a coupling component of the connectors 140 and 150 and the support 130.

Bending of the displays 110 and 120 may be implemented by a bending driver 213. In the displays 110 and 120 which are fixed up and down and bent in a left and right direction, a fixed structure which is not bent in an up and down direction is required.

A center bracket 214 is provided up and down at the center of the displays 110 and 120 in a left and right direction, and a side bracket 215 is provided up and down at both ends of the displays 110 and 120 and serves as a framework for obtaining up and down rigidity of the displays 110 and 120. The side bracket 215 may include a left side bracket 215a provided at a both end of the displays 110 and 120 and a right side bracket 215b provided at a right end of the displays 110 and 120.

For sufficient rigidity, the center bracket 214 and each of the side brackets 215a and 215b may be provided in a single body from an upper end of the displays 110 and 120 to a lower end thereof.

Preferably, the center bracket 124 and the side brackets 215a and 215b are provided on the rear surface of the displays 110 and 120 and thus are not seen on the front surface of the display device 100.

A connecting rod 212 connects the bending driver 213 with the side bracket 215. The bending driver 213 may control the bending level of the displays 110 and 120 by ejecting or inserting the connecting rod 212.

The bending driver 213 may include an actuator such as a motor. In this case, whether the displays 110 and 120 are bent and the bending level of the displays 110 and 120 may be determined by electronic control. That is, the connecting rod 212 assembled with the motor may be ejected or inserted in accordance with a rotation of the motor.

As the case may be, bending of the displays 110 and 120 may be implemented by a manual force not automatic bending such as the bending driver 213. In this case, the frame structure coupled to the displays 110 and 120 may be made of a material that facilitates modification and maintenance of a shape. As a main example of the material, there is a shape memory alloy.

The aforementioned back plate 211 may serve as the frame structure. That is, the back plate 211 may be provided to have a material that is favorable for shape modification and maintenance and to be easily bent by an external force.

If the displays 110 and 120 are manually bent, the connecting rod 212 may still be provided for holding of the bending state. A coupling structure for maintaining an ejecting or insertion state of the connecting rod 212 may be provided separately to maintain the bending state.

A coupling unit 221 connects the respective adjacent edges 111 and 121 of the first display 110 and the second display 120 with each other. The coupling unit 221 may be coupled to the rear surfaces of the first display 110 and the second flexible display. Particularly, the coupling unit 221 may be coupled onto the inner side bracket 215 of each of the displays 110 and 120.

The coupling unit 221 may be coupled to the rear surface of each of the displays 110 and 120 in a shape of a metal plate. At this time, the metal material may include a material of which shape may be modified to maintain a coupling state even in case of bending of each of the displays 110 and 120. As a main example, the metal material may be an aluminum plate.

If the bending level of each of the first display 110 and the second display 120 is great, the coupling unit 221 may be provided in the form of a hinge. The coupling unit 221 of a hinge type may hinge-couple the respective adjacent edges 111 and 121 of the first display 110 and the second display 120 with each other.

The coupling unit 221 may be provided at each of a lower end and an upper end to improve connection reliability between the displays 110 and 120.

Figure 6:
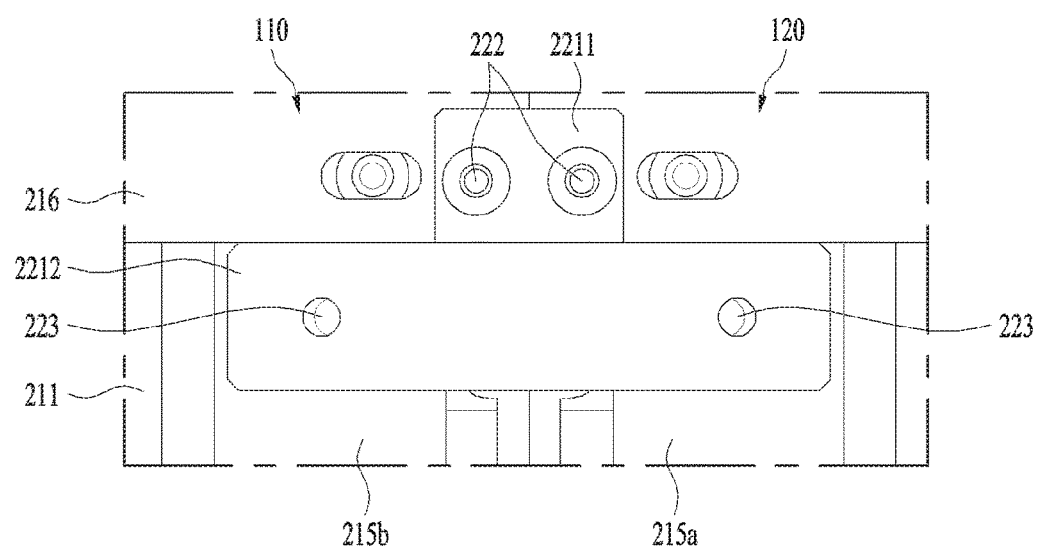
FIG. 6 is an enlarged view of an area A of FIG. 5.

FIG. 6 is an enlarged view of an area A of FIG. 5.

The coupling unit 221 may be provided in a double coupling type to minimize a gap between the displays 110 and 120 and at the same time assure of durability.

The coupling unit 221 may include a first coupling unit 2211 and a second coupling unit 2212. The first coupling unit 2211 may couple the first display 110 to the second display 120 by forming two first screw holes 222, and the second coupling unit 2212 may couple the first display 110 to the second display 120 by forming two second screw holes 223.

A distance between the two first screw holes 222 may be shorter than the distance between the two second screw holes 223. The first coupling unit 2211 having a relatively short coupling length may minimize a gap between the displays 110 and 120, which is caused due to the second coupling unit 2212 having a relatively long coupling length.

The second coupling unit 2212 compensates for rigidity and improves coupling reliability by preventing stress concentration that may occur when the first coupling unit 2211 is only provided.

That is, the first coupling unit 2211 and the second coupling unit 2212 may improve coupling reliability between the displays 110 and 120 and at the same time minimize a gap complementarily.

The first coupling unit 2211 may be coupled to a case top 216 surrounding a rear edge of the back plate 211, and the second coupling unit 2212 may be coupled to its adjacent side bracket 215.

Since the first coupling unit 2211 and the second coupling unit 2212 have their respective coupling points different from each other for their roles, it is preferable that each of them is provided as a separate component.

Referring to FIG. 5 again, the support 130 may be provided at the rear of the display device 100. That is, the support 130 may be provided in a rear direction of the display panel so as not to be seen on the front surface of the display device 100.

The support 130 may be configured by combination of a plurality of horizontal bars 131 and a plurality of vertical bars 132 to provide sufficient rigidity and at the same time minimize increase of a volume and weight of the display device 100.

The horizontal bars 131 supported in the first display 110 will be referred to as first horizontal bars 131a, and the horizontal bars 131 supported in the second display 120 will be referred to as second horizontal bars 131b. The first horizontal bars 131a and the second horizontal bars 131b may be provide in pairs up and down of each of the displays 110 and 120.

First vertical bars 132a are provided in a vertical direction to fixedly connect a pair of the first horizontal bars 131a with each other, and second vertical bars 132b are provided in a vertical direction to fixedly connect a pair of the second horizontal bars 131b with each other.

A holding bar 134 fixedly connects the first vertical bars 132a with the second vertical bars 132b, whereby the support 130 may be fixed to the holding bar 134 to form a single body.

Figure 7:
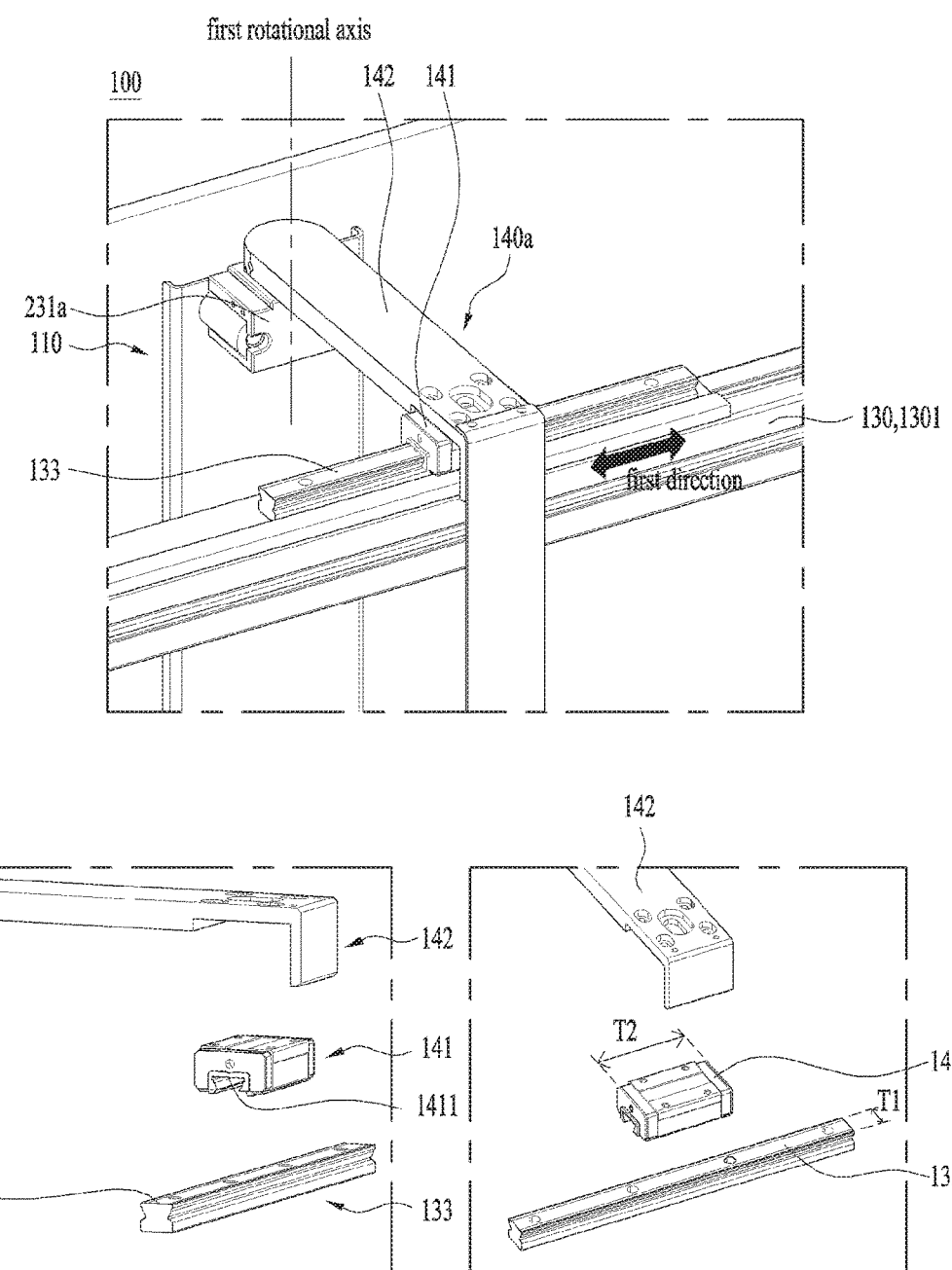
FIG. 7 is an enlarged view of an area B of FIG. 5.

FIG. 7 is an enlarged view of an area B of FIG. 5.

The support 130 is provided with a guide rail 133 formed in a first direction. The first connector 140, specifically a slider 141 of the first connector 140 is fixed to the guide rail 133, whereby the guide rail 133 may guide a path for slidably moving the slider 141.

The slider 141 may be a partial component of the first connector 140. Since the slider 141 directly performs frictional behavior with the guide rail 133, it is required to minimize a frictional force and noise during friction with the guide rail 133. For example, the guide rail 133 may include a metal material, and the slider 141 may include an elastic material such as poly-carbonate or rubber.

A force of several directions, which acts on the first rotational axis of the first connector 140, is transferred to the slider 141. Therefore, a force of another direction as well as a force of the first direction and a couple force according to a difference between action points of the forces also act on the slider 141. However, the force of the direction other than the first direction or the couple force is counterbalanced by the guide rail 133. Therefore, much load or stress may occur in the slider 141 and the guide rail 133. The slider 141 may configure a width T2 of the first direction to be greater than a width T1 coupled to the guide rail 133, whereby the forces acting on directions other than the first direction may be distributed and then counterbalanced.

The guide rail 133 may include a protrusion 1331, and the slider 141 may include a groove 1411 into which the protrusion 1331 of the guide rail 133 is inserted. The protrusion 1331 of the guide rail 133 may have one end which is protruded and has a width wider than the other end to allow the groove 1411 of the slider 141 not to be loose.

A link bar 142 of the first connector 140 may be provided in a vertical direction with the first direction of the horizontal direction of the display device 100. The link bar 142 may be fixedly coupled to the slider 141 and move in parallel together with the slider 141 toward the first direction. The link bar 142 and the slider 141 may be coupled to each other by screw coupling. As described above, the link bar 142 may be formed at a sufficient long length considering the bending level of each of the displays 110 and 120.

Referring to FIG. 5 again, the first connector 140 may be provided at each of a pair of first horizontal bars 131a provided up and down in the support 130. Coupling between a pair of the first horizontal bars 131a and the first connector 140 may distribute load applied to the support 130 by means of the first display 110 and suppress torsional forces that may occur when the first bars 131a and the first connector 140 are bent by the first display 110 and then move slidably.

Figure 8:
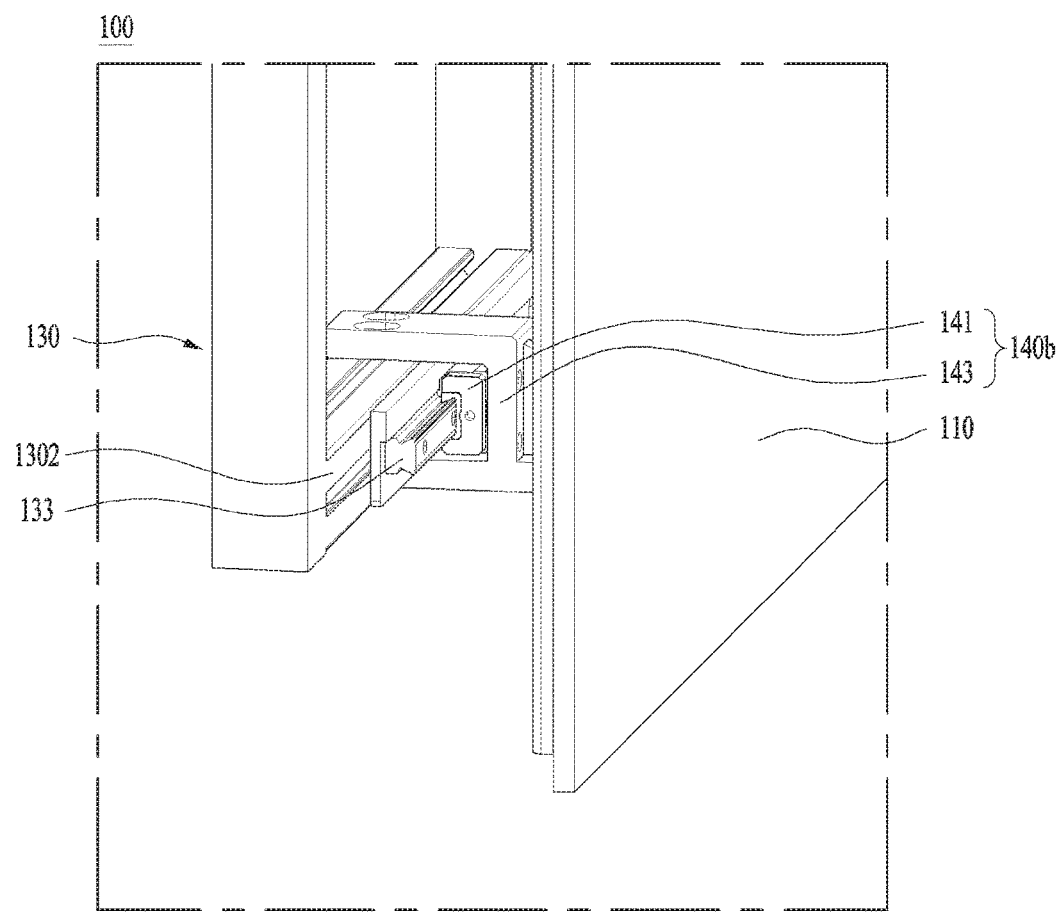
FIG. 8 is an enlarged view of an area C of FIG. 5.

FIG. 8 is an enlarged view of an area C of FIG. 5.

The guide rail 133 may be provided on an upper end 1301 of the support 130 as shown in FIG. 7 but may be provided at a side 1302 of the support 130 as shown in FIG. 8 if necessary. Among a pair of the first horizontal bars 131a provided up and down of the support 130, load of the display 110 applied to the first horizontal bar 131a of the lower end may be greater than that of the display applied to the first horizontal bar 131a of the upper end due to an effect of gravity. Therefore, since greater friction may occur in the first horizontal bar 131a of the lower end, it is preferable that the guide rail 133 is provided toward the side 1302 of the support 130 to minimize an effect of load.

Also, regardless of slid behavior, the first connector 140 supported in each of the two horizontal bars 131 may allow the first connector 140ab of the lower end to be fixed or coupled to the support 130 more stably than the first connector 140a of the upper end. That is, the first connector 140b of the lower end is stably coupled to the support 130 through a '⊏' shaped link bar 143 which holds both the upper and lower surfaces of the horizontal bar 131 unlike the '⊓' shaped link bar 142 of the first connector 140a of the upper end.

The first horizontal bars 131a which are provided up and down may be replaced with a pair of second horizontal bars 132a of the second flexible display 120, and the two first connectors 140a and 140b may be replaced with two second connectors 150a and 150b. That is, except slid behavior property, the same properties may be applied to the first display 110 and the second display 120. Therefore, a repeated description will be omitted.

Figure 9:
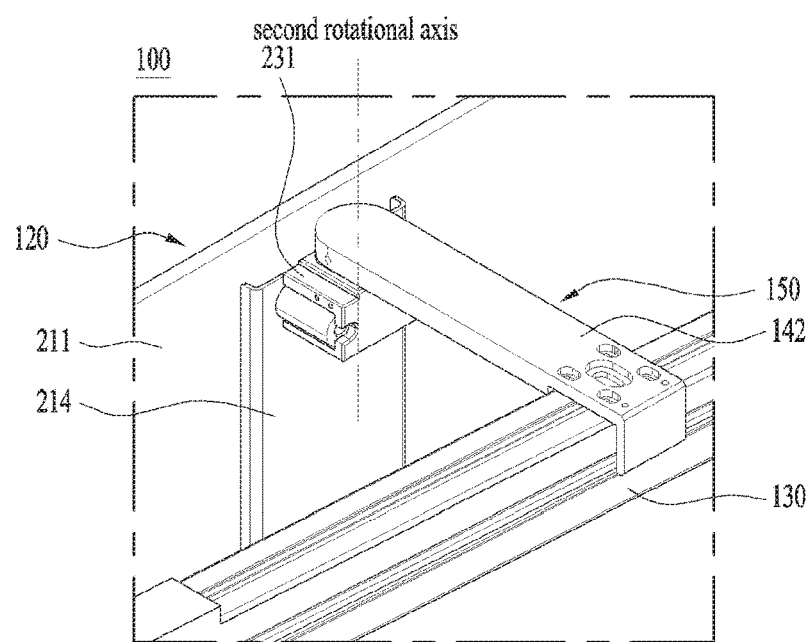
FIG. 9 is an enlarged view of an area D of FIG. 5.
Figure 9:
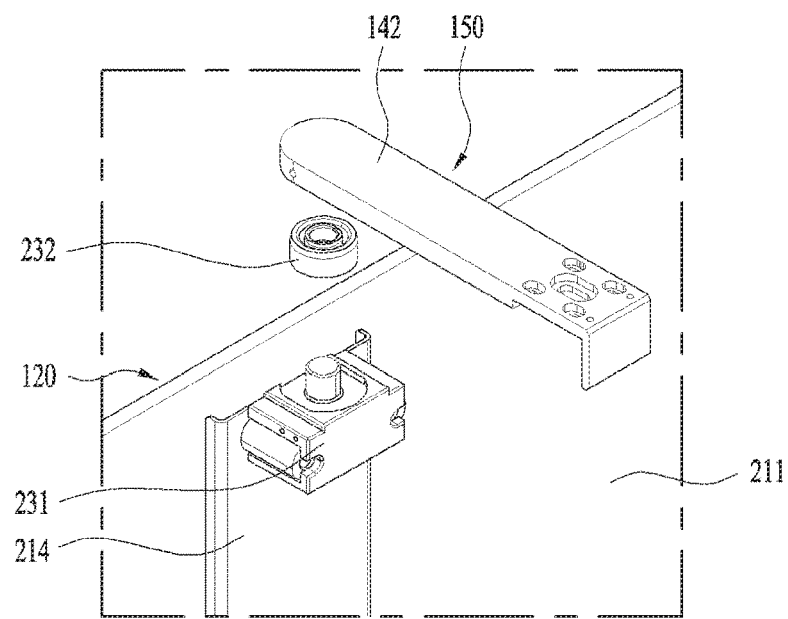

FIG. 9 is an enlarged view of an area D of FIG. 5.

This embodiment relates to a rotation coupling of the second connectors 150 and the second rotator 231b.

Although FIG. 9 illustrates an area of the second connector 150, since rotation coupling is equally applied to the first connector 140 and the second connector 150, the properties of this embodiment may be applied to both the first connector 140 and the second connector 150. Therefore, repeated description and drawings will be omitted.

Each of the connectors 140 and 150 is hinge-coupled with each of the displays 110 and 120 through the rotator 231. The rotator 231 is relatively rotated with respect to the connectors 140 and 150 in accordance with left and right bending of each of the displays 110 and 120.

The function of the rotator 231 has been described as above, and the functions of the first rotator 231a and the second rotator 231b are also identical to the aforementioned functions. Therefore, a repeated description will be omitted.

The rotator 231 may be fixedly provided on each of rear surfaces of the displays 110 and 120. For example, the rotator 231 may be fixedly coupled to the back plate 211 or the center bracket 214. The center bracket 214 may serve to obtain rigidity up and down of the displays 110 and 120 and provide a target to which the rotator 231 may be coupled.

Bearings 232 for minimizing a frictional force during rotation behavior of the connectors 140 and 150 may be provided between the rotator 231 and the connectors 140 and 150.

That is, the first bearing 232a may be provided on the first rotational axis, and the second bearing 232b may be provided on the second rotational axis.

The bearings 232 may be provided in pairs up and down to correspond to a pair of the connectors 140 and 150.

As the case may be, instead of the bearings 232, bushing may be used to reduce weight and production cost. However, even in this case, the principle of reducing the frictional force is equally applied.

Figure 10:
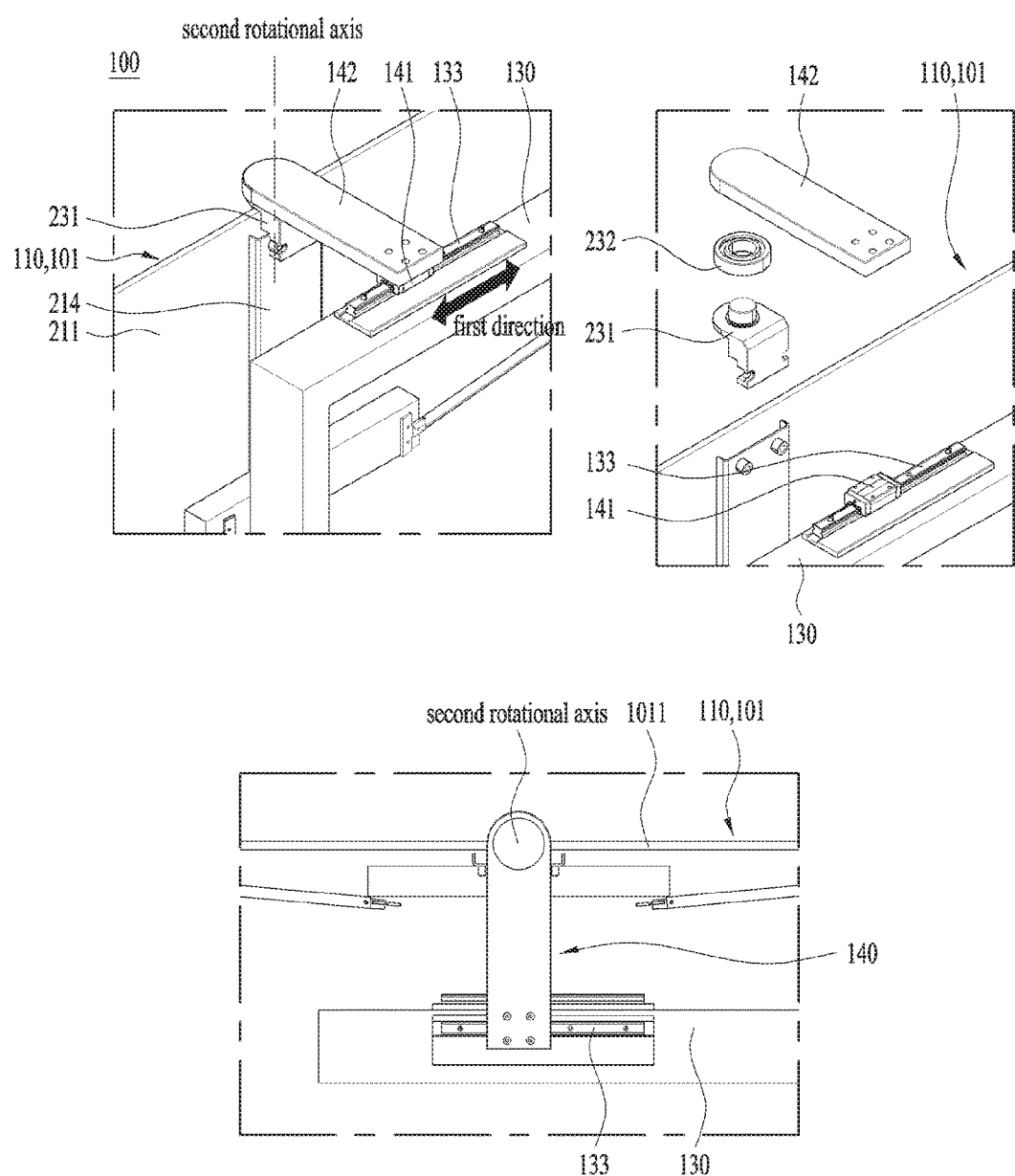
FIG. 10 is a view illustrating a display device according to still another embodiment of the present invention.

FIG. 10 is a view illustrating a display device 100 according to still another embodiment of the present invention.

Unlike the aforementioned embodiment, the rotator 231 and each of the connectors 140 and 150 may be coupled to each other on the upper surface or the lower surface of the displays 110 and 120. That is, this means that the first rotational axis and the second rotational axis are on a line configured by the displays 110 and 120, that is, an upper surface 1011 of the case 101. This allows the distance between the first connector 140 and the second connector 150 to be maintained equally when the displays 110 and 120 are arranged to be concave or convex at the same curvature. This improves the possibility of prediction for bending at a predetermined curvature. This may particularly be required for two display devices 100 of 2×4 or 2×2×2 arrangement in which the display device 100 of 2×2 arrangement is provided. This detailed description will be omitted.

Referring to FIG. 5 again, in view of balance and stability of force, it is preferable that a pair of connectors 140 and 150 are provided to be spaced apart from the upper end and the lower end of the display device 100. Therefore, in the display device of 1×2 arrangement, the connectors 140 and 150 may be provided to be spaced apart from the upper end and the lower end of the displays 110 and 120.

As described above, the display device 100 of 1×2 matrix arrangement may be generalized in m×n matrix arrangement, and numbers of matrix arrangement may be increased or decreased if necessary within the range that does not depart from the features of the present invention.

Figure 11:
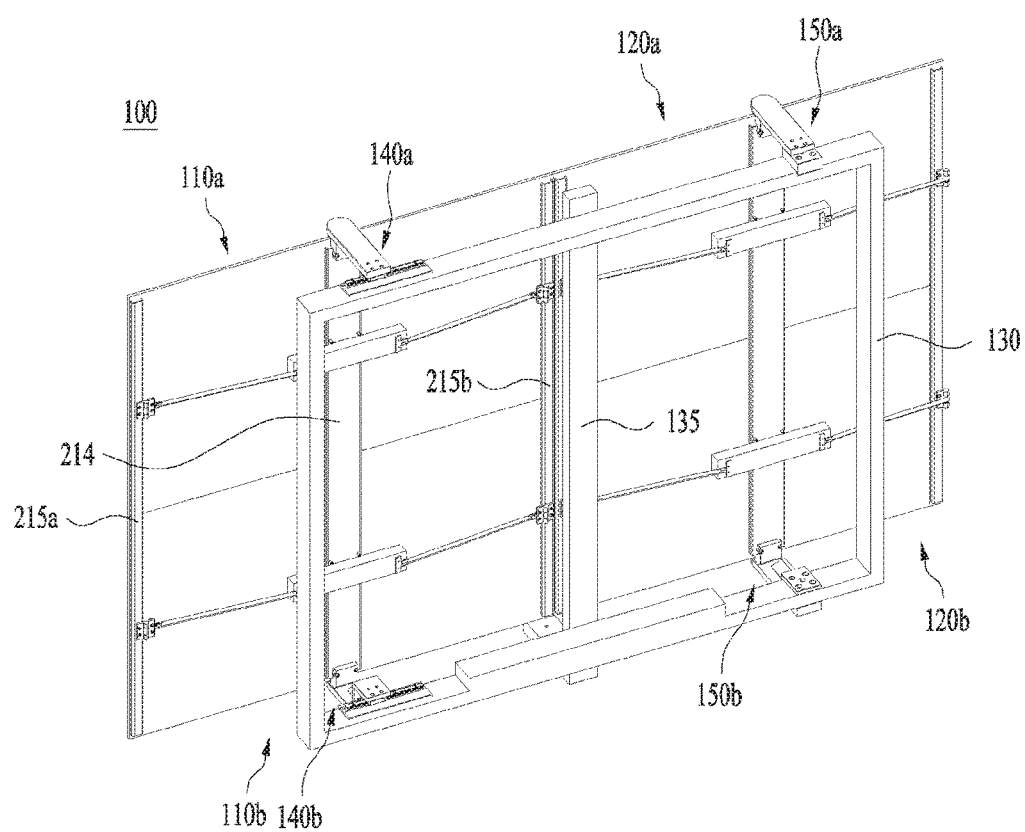
FIG. 11 is a view illustrating a display device according to further still another embodiment of the present invention.

FIG. 11 is a view illustrating a display device 100 according to further still another embodiment of the present invention.

The display device 100 of 1×2 matrix arrangement may be enlarged with respect to a vertical direction and then may be provided as a display device 100 of 2×2 matrix arrangement.

The display device 100 of 2×2 matrix arrangement may be provided in such a manner that properties of the display device 100 of 1×2 matrix arrangement are repeated up and down except properties which will be described later.

The upper connectors 140a and 150a may be provided at respective displays 110a and 120a of a first column and the lower connectors 140b and 150b may be provided at respective displays 110b and 120b of a second column. That is, four connectors 140a, 140b, 150a and 150b may be provided at four displays 110a, 110b, 120a and 120b, whereby a minimum connection structure may be implemented. That is, as an unnecessary connection structure may be omitted, increase of weight and production cost may be avoided.

Although the embodiment of FIG. 11 illustrates the embodiment of FIG. 10 that the connectors 140 and 150 are arranged on the upper surfaces or the lower surfaces of the displays 110 and 120, the present invention is not limited to this embodiment, and the connectors may be provided on rear surfaces of the displays 110 and 120 in the same manner as the embodiment of FIG. 9.

The center bracket 214 and the side bracket 215 may be provided in a single body that connects the displays 110a and 120a of the first column with the displays 110b and 120b of the second column. That is, the center bracket 214 and the side bracket 215 may serve to perform a framework that fixes the upper displays 110a and 120a to the lower displays 110b and 120b and at the same time maintain rigidity so as not to bend the displays up and down.

Although the center bracket 214 and the side bracket 215 may be provided in a single body, they may be provided at each of the displays 110a, 110b, 120a and 120b as the case may be, wherein adjacent up and down components of the center bracket 214 and the side bracket 215 may be fixed by a separate piece.

The support 130 may be provided in a rectangular frame shape that connects four connectors 140a, 140b, 150a and 150b with one another to reduce weight and production cost.

However, the support 130 of the rectangular frame shape may be vulnerable to torsional forces due to increased widths of up and down and left and right directions. A rigid bar 135 may compensate for rigidity by linking horizontal center or vertical center of the support 130 of the rectangular frame shape.

Figure 12:
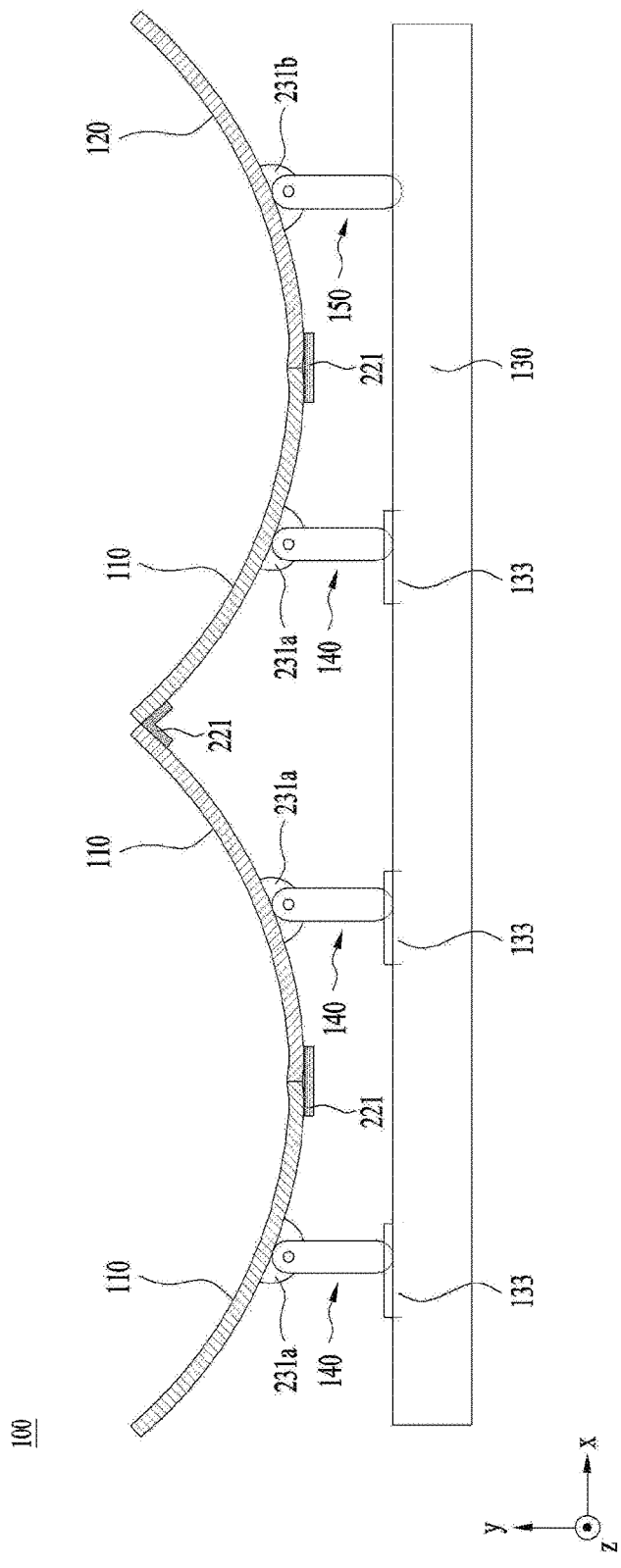
FIG. 12 is a conceptual view illustrating a display device according to another embodiment of the present invention.

FIG. 12 is a conceptual view illustrating a display device according to another embodiment of the present invention.

The display device 100 may be configured by combination of displays 110 and 120 of 2×4 arrangement. If four displays 110 and 120 are provided in a horizontal direction, four connectors 140 and 150 may be provided in a horizontal direction.

The four displays 110 and 120 may be regarded as one component in such a manner that adjacent displays are coupled to each other by the coupling unit 221.

At this time, the four connectors 140 and 150 may include one second connector 150 fixedly coupled to the support 130 and three first connectors 140 slidably coupled tot eh support 130. This is because that the four connectors 140 and 150 are enough to have one fixed point only connected with the support 130 because one connector is fixed to one support 130.

However, the four displays 110 and 120 in a horizontal direction cannot be provided in a concave or convex shape under the condition of the embodiment of FIG. 12.

In this respect, a rotational structure of the support will be suggested as follows.

Figure 13:
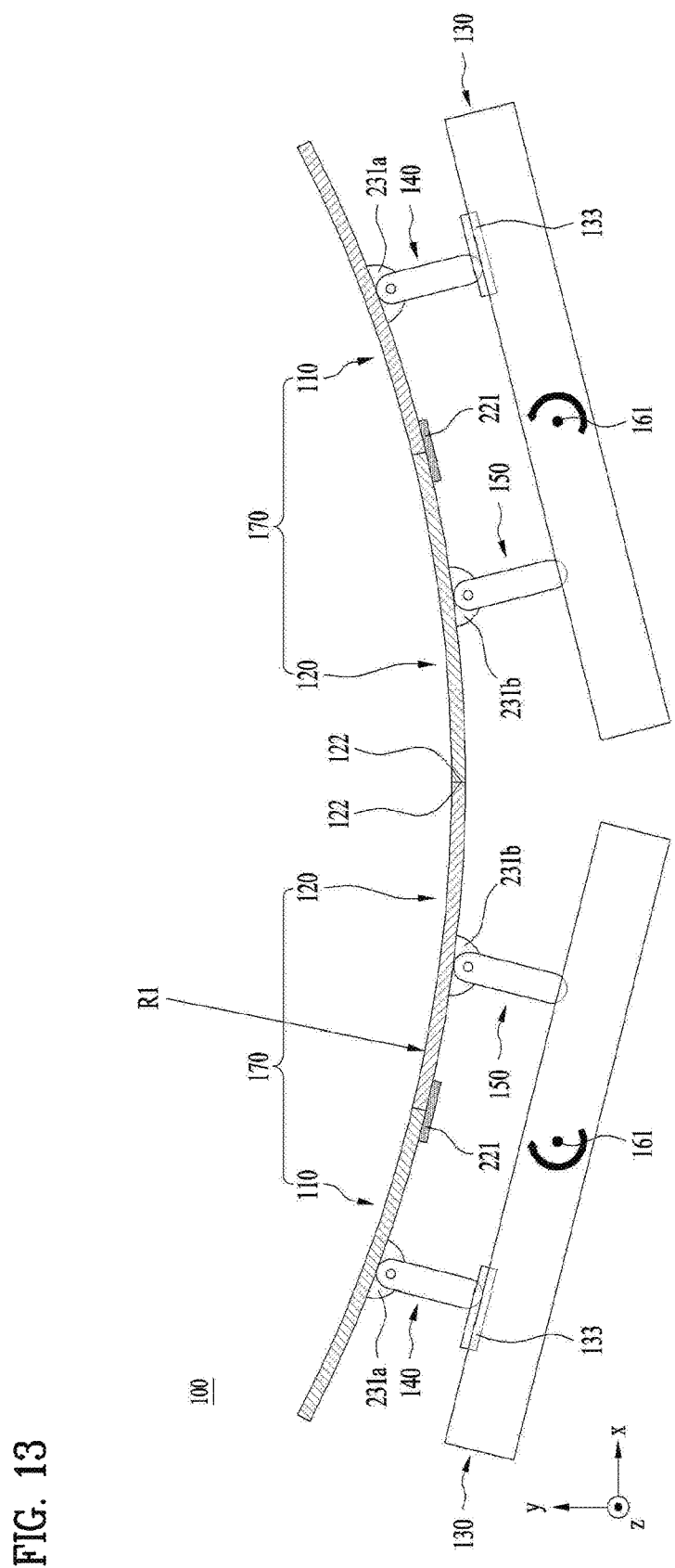
FIG. 13 is a conceptual view illustrating a display device according to still another embodiment of the present invention.
Figure 14:
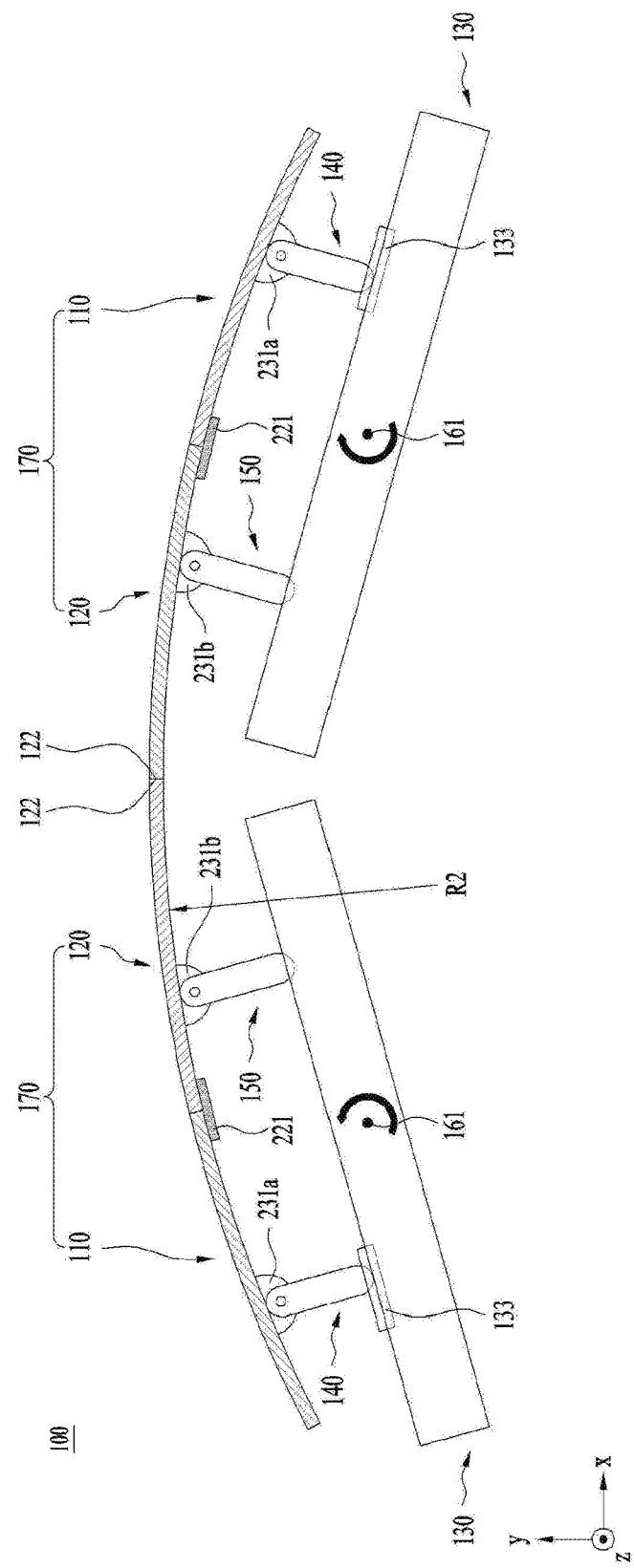
FIG. 14 is a conceptual view illustrating a display device according to further still another embodiment of the present invention.

FIG. 13 is a conceptual view illustrating a display device 100 according to still another embodiment of the present invention. FIG. 14 is a conceptual view illustrating a display device 100 according to further still another embodiment of the present invention.

To implement a single convex surface or concave surface using displays of 2×4 matrix arrangement, two 2×2 matrix arrangement components 170 may be provided unlike FIG. 12 illustrating that four displays are connected with one another as one component. At this time, adjacent edges of the two displays 110 and 120 are connected with each other by the coupling unit 221 in the same manner as the shape of FIG. 5.

Therefore, since the adjacent edges 122 of the two 2×2 matrix arrangement components 170 are connected with each other by the coupling unit 221, the edges may be detached from each other. However, it is required that the adjacent edges 122 should be provided to adjoin each other in a specific state that bending is generated and behavior is completed in view of an object of the present invention.

Each of the 2×2 matrix arrangement components 170 is fixed by each support 130, wherein each support 130 may be rotated independently by a rotation driver 161 rotatably coupled thereto. The rotation driver 161 may rotate the two 2×2 matrix arrangement components 170, whereby the four displays 110 and 120 may form a single concave surface as shown in FIG. 13 or a single convex surface as shown in FIG. 14.

Particularly, if the rotational axes of the connectors 140 and 150 are provided on the upper surfaces or the lower surfaces of the displays 110 and 120 as shown in FIG. 10, a curvature R1 of the concave surface shown in FIG. 13 and a curvature R2 of the convex surface shown in FIG. 14 may be implemented equally.

Even in case of the embodiments of FIGS. 13 and 14 in which the rotation driver 161 is provided, since the distance between the rotation drivers 161 of the respective supports 130 is not changed, one curvature value for allowing the adjacent edges 122 to adjoin each other may be specified.

This restriction may be resolved by a slide driver 162.

Figure 15:
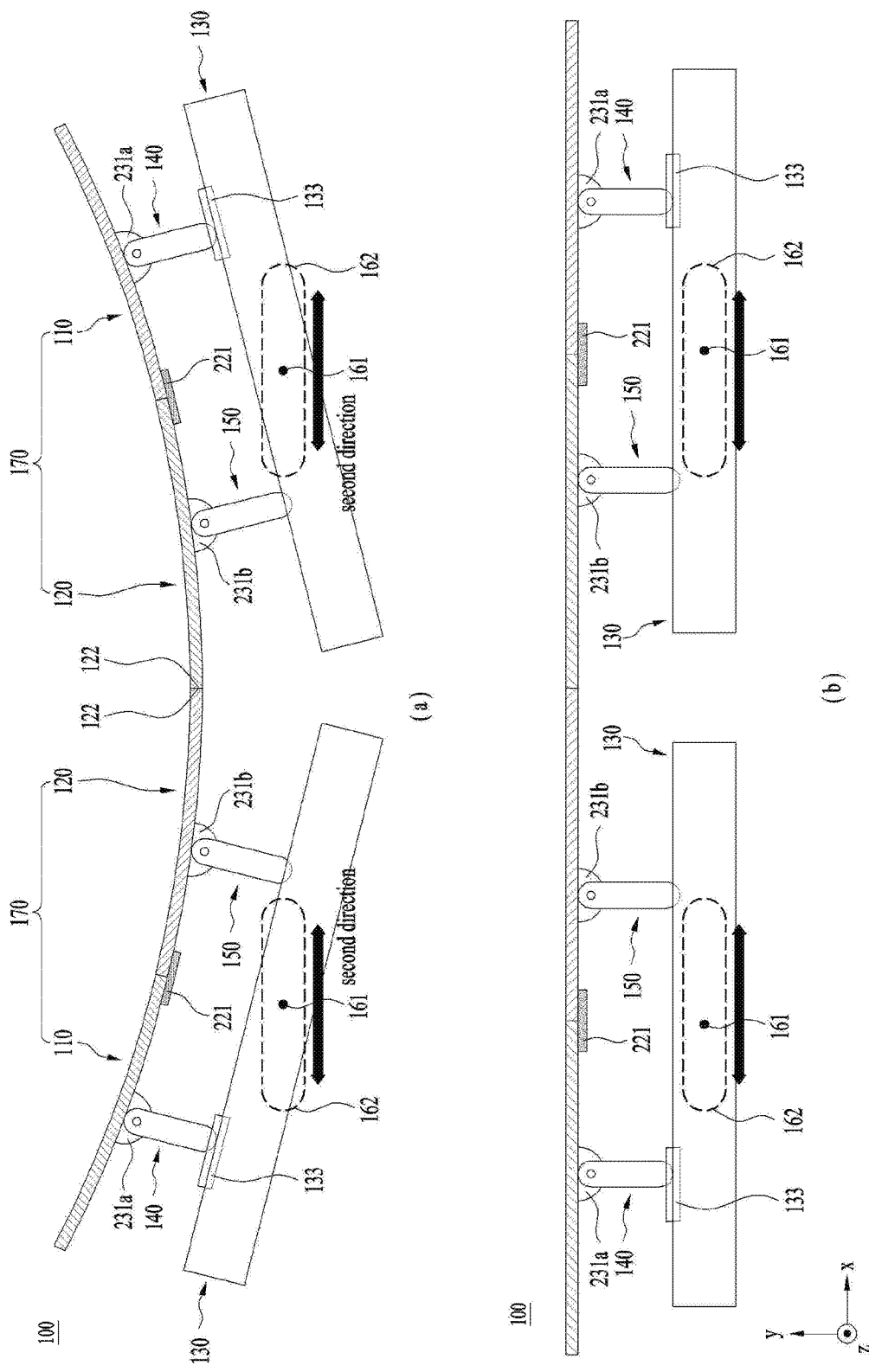
FIG. 15 is a conceptual view illustrating a display device according to further still another embodiment of the present invention.

FIG. 15 is a conceptual view illustrating a display device 100 according to further still another embodiment of the present invention.

The slide driver 162 provides a guide to allow the supports 130 to perform parallel movement with respect to a second direction. The 2×2 matrix arrangement components 170 may be far away from or close to each other in accordance with parallel movement of the supports 130.

Therefore, a desired curvature or plane may be configured, whereby a gap or overlap may be prevented from occurring between the adjacent edges 122 of the two 2×2 matrix arrangement components 170.

The respective 2×2 matrix arrangement components 170 may perform rotation and parallel movement at the same time by the rotation driver 161 and the slide driver 162. Therefore, the single convex or concave surface shown in FIG. 13(a) may be modified to the single plane shown in FIG. 13(b) and various shapes may be configured.

It will be appreciated by those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A display device, comprising:
a display panel configured to bend;
a support coupled to the display panel to support the display panel;
a first connecting rod, wherein a first end of the first connecting rod is rotatably coupled to the display panel and a second end of the first connecting rod is slidably coupled to the support; and
a second connecting rod, wherein a first end of the second connecting rod is rotatably coupled to the display panel and a second end of the second connecting rod is fixed to the support;
wherein, when the display panel is controlled to bend, the first connecting rod rotates relative to the display panel and simultaneously slides relative to the support, and the second connecting rod rotates relative to the display panel.

2. The display device of claim 1, further comprising a motor coupled to the display panel to bend the display panel.

3. The display device of claim 1, wherein the display panel includes
a first display panel, and
a second display panel coupled adjacent to the first display panel,
wherein the first display panel and the second display panel are configured to bend independently.

4. The display device of claim 3, wherein the second display panel is controlled to bend simultaneously with the first display panel.

5. The display device of claim 3, wherein a lateral side of the first display panel is fixed to a lateral side of the second display panel.

6. The display device of claim 3, further comprising a third display panel and a fourth display panel, wherein the third display panel is coupled to a lower side of the first display panel and the fourth display panel is coupled to a lower side of the second display panel and a lateral side of the third display panel.

7. The display device of claim 6, further comprising at least one display panel coupled to at least one of a lateral side, an upper side or a lower side of the first to fourth display panels.

8. The display device of claim 1, wherein the display panel includes a plurality of display panels arranged in a prescribed number of rows and a prescribed number of columns.

9. The display device of claim 8, wherein the display panel is configured to be expandable to accommodate additional display panels in the prescribed number of rows or the prescribed number of columns.

10. The display device of claim 1, further comprising a guide member fixed to the support, wherein the second end of the first connecting rod is slidably coupled to the guide member.

11. The display device of claim 10, wherein
when the display panel is in a flat state, the first connecting rod is at a first angle relative to the display panel and the second end of the first connecting rod is at a first position on the guide member, and
when the display panel is in a curved state, the first connecting rod is rotated at the first end such that the first connecting rod is at a second angle relative to the display panel and the second end of the first connecting rod is simultaneously moved to a second position on the guide member.

12. The display device of claim 1, wherein the support is at least one of a bracket or a frame.

13. A multivision display device, comprising:
a plurality of display panels arranged in a prescribed number of rows and a prescribed number of columns, the plurality of display panels being configured to bend;
a support coupled to the plurality of display panels to support the plurality of display panels;
a first connecting rod coupled between some of the plurality of display panels and the support, wherein a first end of the first connecting rod is rotatably coupled to the some of the plurality of display panels and a second end of the first connecting rod is slidably coupled to the support; and
a second connecting rod between rest of the plurality of display panels and the support, wherein a first end of the second connecting rod is rotatably coupled to the rest of the plurality of display panels and a second end of the second connecting rod is fixed to the support,
wherein, when the plurality of display panels is configured to bend, the first connecting rod rotates relative to the some of the plurality of display panels and simultaneously slides relative to the support, and the second connecting rod rotates relative to the rest of the plurality of display panels.

14. The multivision display device of claim 13, further comprising a motor coupled to at least one of the display panels to bend the display panels.

15. The multivision display device of claim 13, wherein the display panels are controlled to bend simultaneously with each other.

16. The multivision display device of claim 13, further comprising a guide member fixed to the support, wherein the second end of the first connecting rod is slidably coupled to the guide member.

17. The multivision display device of claim 16, wherein
when some of the plurality of display panels is in a flat state, the first connecting rod is at a first angle relative to the display panel and the second end of the first connecting rod is at a first position on the guide member, and
when some of the plurality of display panels is in a curved state, the first connecting rod is rotated at the first end such that the first connecting rod is at a second angle relative to the display panel and the second end of the first connecting rod is simultaneously moved to a second position on the guide member.

18. The multivision display device of claim 13, wherein the support is at least one of a bracket or a frame.

* * * * *